United States Patent
Shenoy et al.

(10) Patent No.: US 8,508,074 B2
(45) Date of Patent: Aug. 13, 2013

(54) SYSTEM AND METHOD FOR OPTIMIZING SOLAR POWER CONVERSION

(75) Inventors: Pradeep S. Shenoy, Urbana, IL (US); Philip T. Krein, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 13/340,076

(22) Filed: Dec. 29, 2011

(65) Prior Publication Data

US 2012/0091800 A1 Apr. 19, 2012

Related U.S. Application Data

(60) Provisional application No. 61/553,125, filed on Oct. 28, 2011.

(51) Int. Cl.
*H02J 1/00* (2006.01)
(52) U.S. Cl.
USPC .............................. 307/82; 307/77
(58) Field of Classification Search
USPC .................................... 307/77, 82
See application file for complete search history.

(56) References Cited

U.S. PATENT DOCUMENTS

| | | |
|---|---|---|
| 2009/0160258 A1 | 6/2009 | Allen et al. |
| 2009/0179500 A1 | 7/2009 | Ragonese et al. |
| 2010/0253150 A1 | 10/2010 | Porter et al. |
| 2011/0031816 A1 | 2/2011 | Buthker et al. |
| 2011/0115297 A1 | 5/2011 | de Waal et al. |

FOREIGN PATENT DOCUMENTS

| | | |
|---|---|---|
| JP | 2004055603 | 2/2004 |
| JP | 2008198829 | 8/2008 |
| WO | 2004006342 | 1/2004 |

OTHER PUBLICATIONS

Geoffrey R. Walker, et al, Cascaded DC-DC Converter Connection of Photovoltaic Modules, Power Electronics Specialists Conference, pp. 24-29, vol. 1, Nov. 7, 2002, IEEE.
Toshihisa Shimizu, et al, Generation Control Circuit for Photovoltaic Modules, IEEE Transactions on Power Electronics, vol. 16, No. 3, May 2001, pp. 293-300, IEEE.
Roberto Giral, et al, Minimizing the Effects of Shadowing in a PV module by Means of Active Voltage Sharing, IEEE Conference on Industrial Technology (ICIT),Mar. 14-17, 2010, pp. 943-948, IEEE.
Geoffrey R. Walker, et al, Photo Voltaic DC-DC Module Integrated Converter for Novel Cascaded and Bypass Grid Connection Topologies—Design and Optimisation; School of Information Technology and Electrical Engineering, University of Queensland 4072 Australia, Power Electronics Specialists Conf., Jun. 18-22, 2006, pp. 1-7, IEEE.

(Continued)

*Primary Examiner* — Hal Kaplan
(74) *Attorney, Agent, or Firm* — Grasso PLLC; Fred Grasso

(57) ABSTRACT

A solar power system is provided for maximizing solar power conversion. The solar power system includes n power units connected in series and n-1 DC-DC converting units, and each of the n-1 DC-DC converting units is coupled to at least one of n solar power units. Each of the n-1 DC-DC converting units is configured to control the correspondingly connected solar power units to operate at a target current generation. The solar power system further includes a controlling unit coupled to the n-1 DC-DC converting units. The controlling unit monitors and compares the n currents generated by the n solar power units. Based on the current comparison, the controlling unit determines a series current and controls the n solar power units so that each of the generated photovoltaic currents is substantially equal to the determined series current.

20 Claims, 14 Drawing Sheets

(56) References Cited

OTHER PUBLICATIONS

G.R. Walker, et al, PV String Per-Module Maximum Power Point Enabling Converters; School of Information Technology and Electrical Engineering, The University of Queensland; Australasian Universities Power Engineering Conference, AUPEC 2003, Sep. 28, 2003-Oct. 1, 2003, pp. 112-117.

Jang Pil Lee et al., A Novel Topology for Photovoltaic Series Connected DC/DC Converter with High Efficiency Under Wide Load Range, Power Electronics Specialists Conference, Jun. 17-21, 2007, pp. 152-155, IEEE.

Yigal Nimni et al., A Returned Energy Architecture for Improved Photovoltaic Systems Efficiency, Circuits and Systems (ISCAS), Proceedings of 2010 IEEE International Symposium, May 30, 2010-Jun. 2, 2010, pp. 2191-2194, IEEE.

International Search report and Written Opinion, International Application PCT/US2012/062228, Feb. 15, 2013.

SYSTEM AND METHOD FOR OPTIMIZING SOLAR POWER CONVERSION

CROSS-REFERENCE TO RELATED APPLICATION

The present disclosure claims priority to U.S. Provisional Application No. 61/553,125, filed on Oct. 28, 2011, which is herein incorporated by reference in its entirety.

BACKGROUND

Unless otherwise indicated herein, the materials described in this section are not prior art to the claims in this application and are not admitted to be prior art by inclusion in this section.

A photovoltaic (PV) array is a linked collection of solar panels. Most PV arrays use an inverter to convert direct current (DC) power produced by the solar panels into alternating current (AC) power. The panels in a PV array are usually connected in series, as strings, to obtain a desired voltage. A plurality of individual strings is then typically connected in parallel to increase current production.

In conventional PV power generation systems, there is a tradeoff between local power generation and system efficiency. Conventional PV systems do not support local control of PV panels. As shown in FIG. 1, a conventional PV system 100 typically includes a plurality of PV panels 102 connected electrically in series to form a PV string 104, and a single large inverter 106 processes power from the entire PV series string 104 for delivery to a load or a power grid 108. In this arrangement, if one or more of PV panels 102 are shaded or otherwise environmentally compromised, power production is reduced for the entire string 104. PV panel manufacturers have added reverse diodes to partially mitigate electrical impacts of local shading, soilin, or similar problems.

As known to one of ordinary skill in the art, simultaneously operating each individual PV panel 102 of PV string 104 close to or at its potential maximum power production level, termed a maximum power point (MPP), as enabled by ongoing environmental conditions, has proven to be hard, even impossible, to attain. It is well established that this inability to operate individual PV panels 102 at their corresponding MPPs sacrifices power production. Power reduction can be 20% or more if PV system 100 is subject to local shading, and can be of the order of several percents even when PV system 100 is uniformly illuminated.

A known improvement to the conventional PV system 100 provides local power processing on a per PV panel basis. For illustration purposes, FIGS. 2 and 3 show DC-DC versions 200 and 300 that provide series and parallel connected DC-DC converters 206 and 306, respectively. As shown in FIG. 2, DC-DC converters 206 are connected in series via their respective outputs, while each is also coupled to one of PV panels 208. As shown in FIG. 3, DC-DC converters 306 are connected in parallel via their respective outputs, while each is also coupled to one of PV panels 308. A DC-AC version 400, shown in FIG. 4, provides a direct coupling between a DC-AC inverter 406 and a PV panel power 408, without any DC-DC converters therebetween. Based on the literature, DC-AC version 400 has only been used commercially in a parallel arrangement (not shown) of the DC-AC inverters 406, although a series version (not shown) has been reported.

In each of DC-DC versions 200 and 300, a local DC-DC converter 206, 306 is connected to a respective PV panel 208 308, and to a DC-AC inverter 210, 310, for the delivery of power to a grid 212, 312. The DC-DC versions 200 and 300 sacrifice efficiency, since power needs be processed twice between each PV panel 208, 308 and the grid 200, 300. In AC version 400, a PV system, which includes a large number of PV panels 408, also needs to include a corresponding number of DC-AC inverters 406, each of which processes a power generated by the correspondingly connected PV panel 406, to grid 412. Based on the configurations of FIGS. 2-4, all of the generated power must be processed through local DC-DC converters 206, 306 and DC-AC inverters 406, which can lead to excessive power losses.

SUMMARY

Disclosed herein are improved methods, systems, and devices for optimizing solar power conversion.

In one embodiment, a solar power system includes a set of n power units connected in series, wherein each of the n solar power units generates a DC photovoltaic current and produces a DC photovoltaic voltage. The solar power system includes a set of n-1 DC-DC converting units, each of the n-1 DC-DC converting units is coupled to at least one of the n solar power units, and wherein each of the n-1 DC-DC converting units is configured to control the correspondingly connected solar power units to operate at a target current generation. The solar power system further includes a controlling unit coupled to the n-1 DC-DC converting units, wherein the controlling unit monitors and compares the n currents generated by the n solar power units. Based on the current comparison, the controlling unit determines a series current and controls the n solar power units, via the n-1 DC-DC converting units, so that each of the generated photovoltaic currents is substantially equal to the determined series current, and when the controlling unit determines that one of the n solar power units generates a photovoltaic current that is less than a predetermined current threshold percentage of the determined series current, the controlling unit causes the correspondingly coupled DC-DC converting unit to operate as a current bypass unit.

In another embodiment, a method is provided for maximizing power generation in a power solar system, which includes a set of n series-connected solar power units and a set of n-1 DC-DC converting units. Each of the n solar power units generates a DC photovoltaic current and produces a DC photovoltaic voltage, and each of the n-1 of DC-DC converting units is coupled to and controls at least one of the n solar power units. The method includes monitoring and comparing the n currents generated by the n solar power units, and based on the current comparison, determining a series current for the n solar power units. The method further includes controlling the n solar power units, via the correspondingly coupled n-1 DC-DC converting units, so that each of the generated photovoltaic currents is substantially equal to the determined series current, and determining whether one of the generated photovoltaic currents is less than a predetermined current threshold percentage of the determined series current. Based on the current threshold percentage determination, the method further includes causing the correspondingly coupled DC-DC converting unit to operate as a current bypass unit.

In another embodiment, a non-transitory computer readable storage medium contains instructions that cause a computing system to perform the above-discussed method for optimizing solar power conversion.

In another embodiment, a solar power system includes a plurality of solar power units connected in series, each of the plurality solar power units generates a DC photovoltaic current and produces a DC photovoltaic voltage, and a plurality of DC-DC converting units, each of the plurality DC-DC converting units is coupled to at least one of the plurality of solar power units. Each of the plurality of DC-DC converting units is configured to control the correspondingly connected solar power units so that they operate within a predetermined power range. Each individual DC-DC converting unit is configured to determine whether a correspondingly connected solar power unit generates a corresponding DC photovoltaic current that is outside of a predetermined current range. Based on the outside current range determination, each individual DC-DC converting unit is configured to shunt the correspondingly connected power unit while the other power units remain connected in series.

In another embodiment, a solar power system includes a plurality of solar power units connected in series, each of the plurality solar power units generates a DC photovoltaic current and produces a DC photovoltaic voltage, a DC-AC inverting unit for inverting a cumulative DC photovoltaic voltage of the plurality of produced photovoltaic voltages to an AC power signal for distribution to one or more AC loads, and a plurality of DC-DC converting units. Each of the plurality DC-DC converting units is coupled to at least one of the plurality of solar power units, and is configured to control the correspondingly connected solar power units so that they operate within a predetermined power range. The solar power system further includes a capacitor unit connected in parallel to the plurality of DC-DC converting units.

These as well as other aspects, advantages, and alternatives will become apparent to those of ordinary skill in the art by reading the following detailed description, with reference where appropriate to the accompanying drawings. Further, it should be understood that the disclosure provided in this summary section and elsewhere in this document is intended to discuss the invention by way of example only and not by way of limitation.

DETAILED DESCRIPTION

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Figure 1:
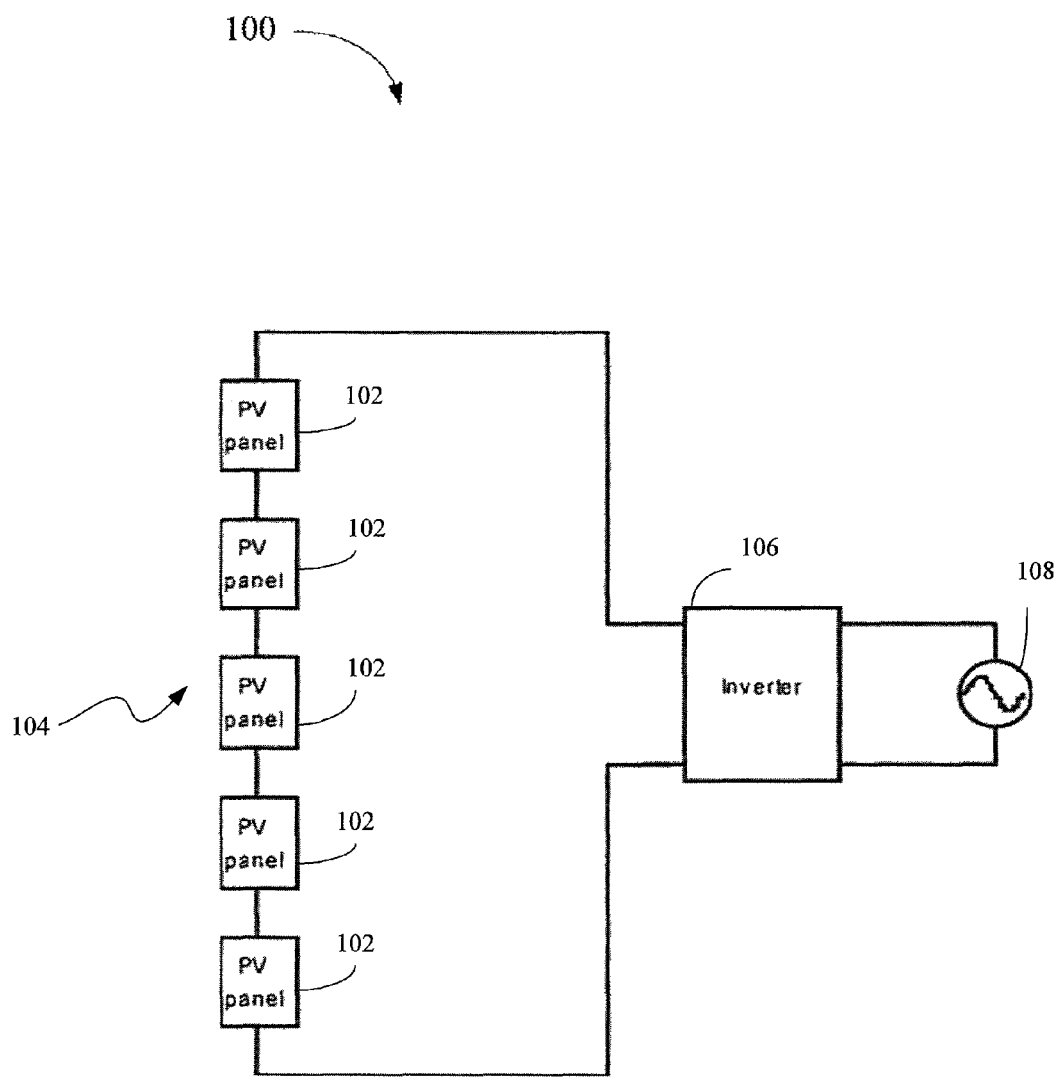
FIG. 1 is a schematic diagram of a known power conversion system including a plurality of PV panels connected in series to a DC-AC inverting unit.
Figure 2:
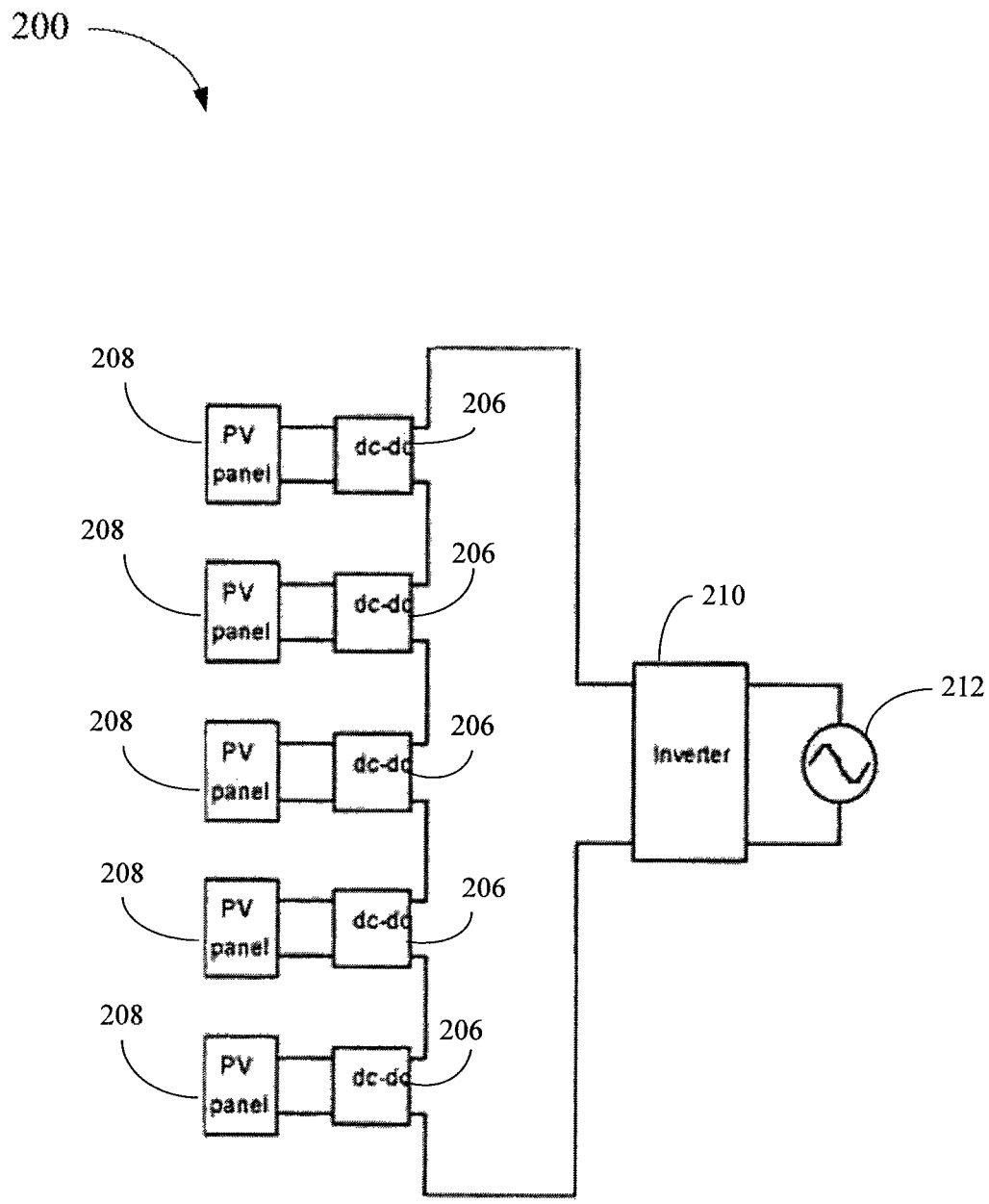
FIG. 2 is a schematic diagram of a known power conversion system including n DC-DC converting units connected in series, each of the DC-DC converting units coupled to a PV panel.
Figure 3:
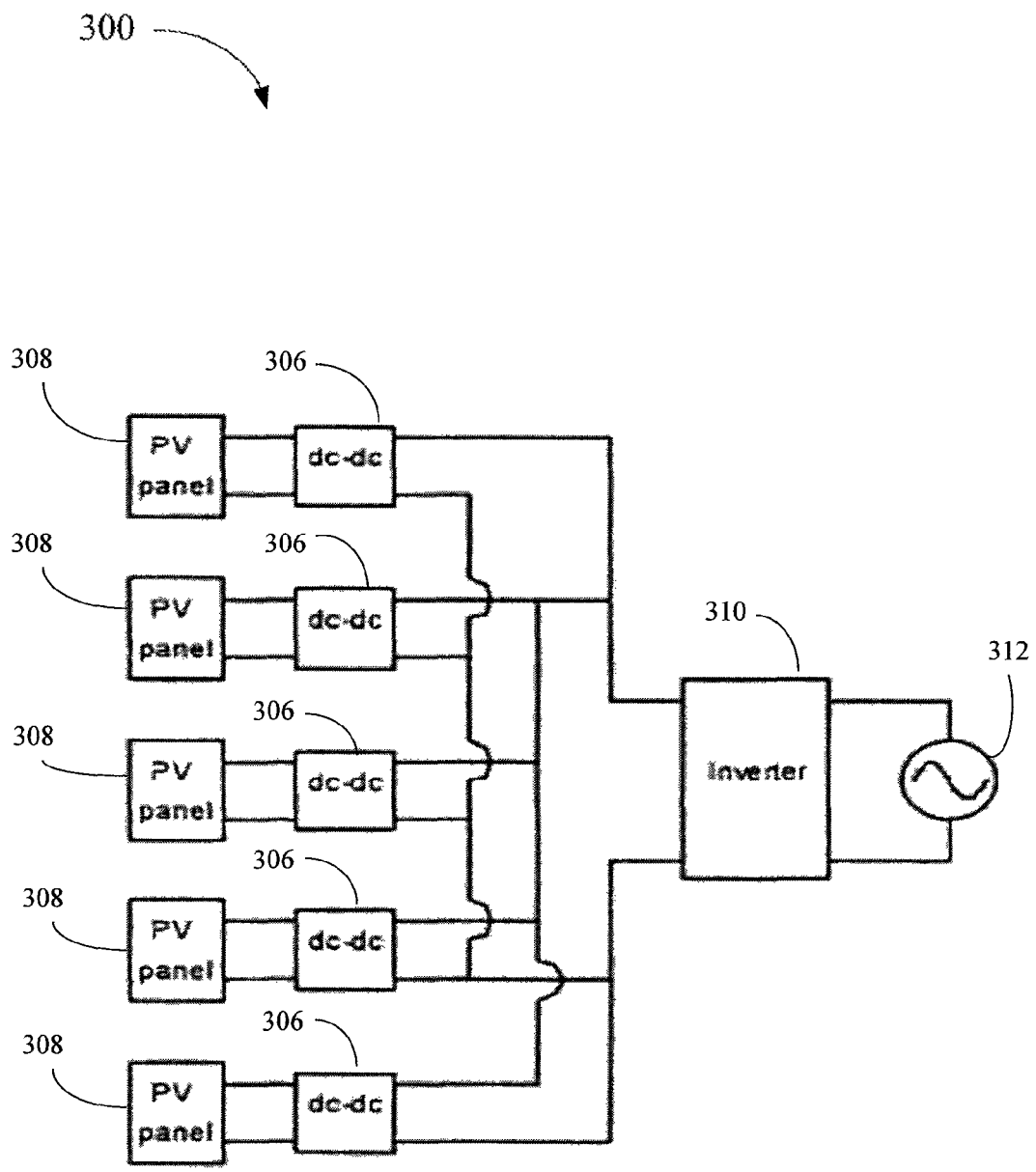
FIG. 3 is a schematic diagram of a known power conversion system including n DC-DC converting units connected in parallel, each of the DC-DC converting unit coupled to a PV panel.
Figure 4:
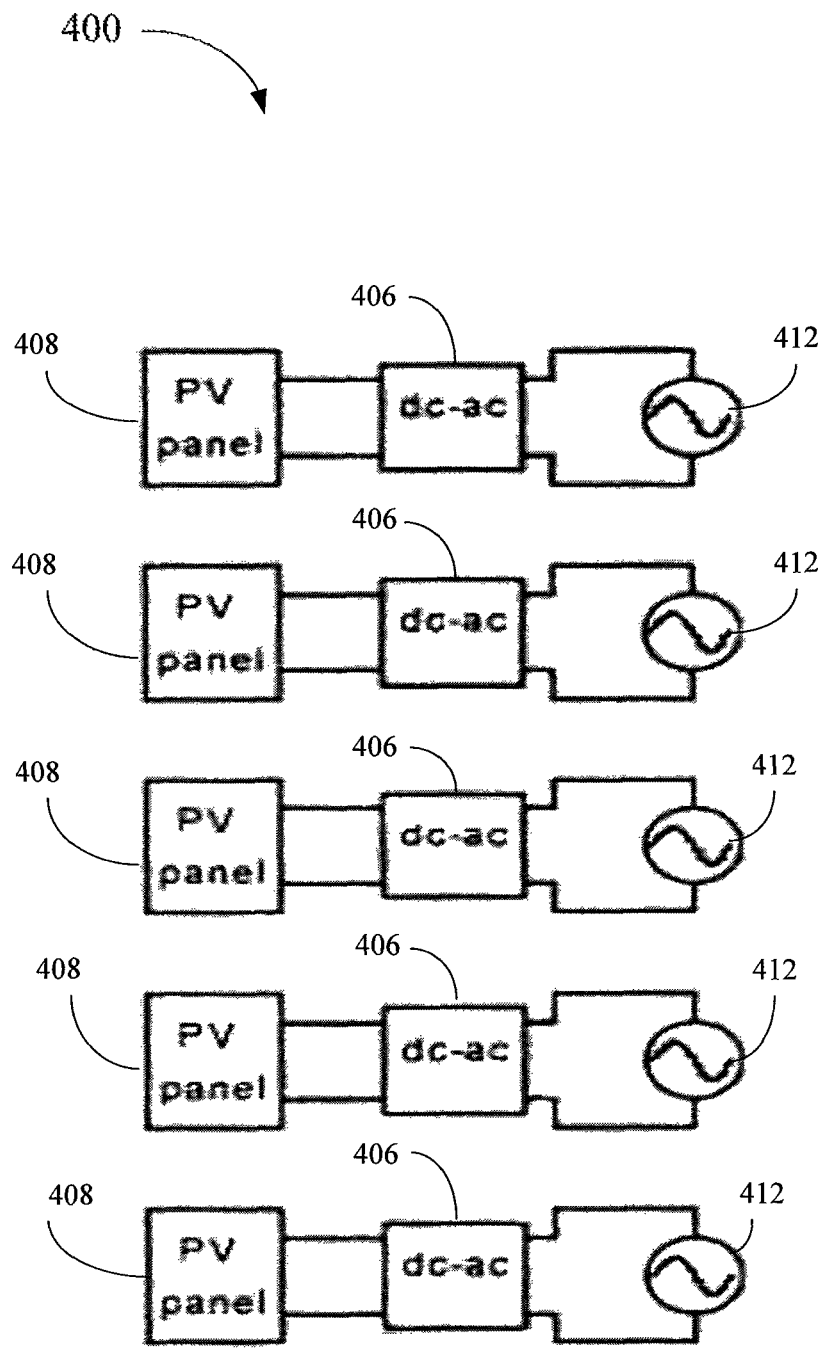
FIG. 4 is a schematic diagram of a known power conversion system including n isolated DC-AC inverters, each of the DC-AC inverters coupling a PV panel to a load.

As stated above, power conversion system 100, 200 and 300, shown in FIGS. 2-4, are substantially inefficient as all of the power generated by PV panels 208, 308, 408 has to be processed by both the correspondingly coupled DC-DC converting units 206, 306 and DC-AC inverting units 406, respectively.

To overcome this inefficient power conversion, an embodiment of a power conversion system includes a plurality of solar power units connected in series, and a plurality of DC-DC converting units, each of which is coupled to at least one of the plurality of solar power units. During operation, MPP values of a set of substantially similar PV panels, connected in series and operating under similar environmental conditions, may be substantially equal. That is, the differences between solar powers produced by the series-connected PV panels are substantially small (minor).

Recognizing that MPP values of the series-connected substantially similar PV panels, operating under similar environmental conditions, may be substantially equal, the above-introduced embodiment of a power conversion system is configured to manage the minor power differences, so as to maximize an overall power generated by the series-connected PV panels. This process of managing minor PV power differences, i.e., differential power processing, is configured to enable MPP tracking on each PV panel, and to process the generated power as little as possible, such as only once by the DC-AC inverting unit, thereby minimizing power losses due to power processing. As such, this management of minor power differences may avoid minor MPP value mismatches, while sending substantially all of the PV power generated by the series-connected PV panels directly to a DC-AC inverting unit for output processing.

Figure 5:
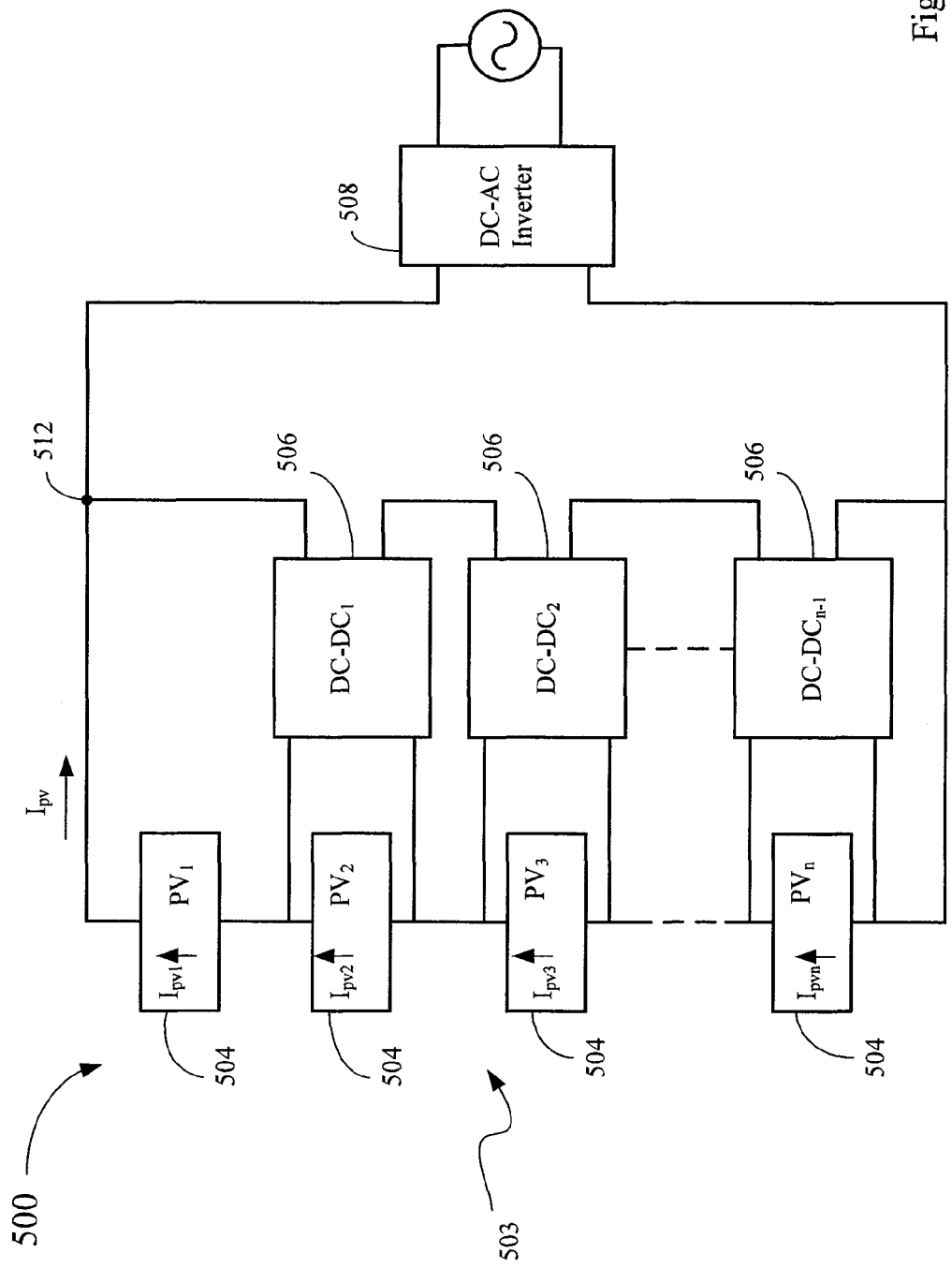
FIG. 5 is a schematic diagram of an exemplary embodiment of a power conversion system including n PV panels connected in series and n-1 DC-DC converting units connected in series.

Now referring to FIG. 5, an embodiment 500 of a PV conversion system configured to implement the above-discussed differential power processing is illustrated. As shown, power conversion system includes "n" PV or solar energy sources or power units 504 connected in series to form a PV panel string 503, and "n-1" DC-DC converting units 506 connected in series. Power conversion system further includes a DC-AC inverting unit 508 coupled to PV panel string 503, and to the n-1 DC-DC converting units 506. Each of the n PV power units 504, which can provide a DC photovoltaic output, may be a PV cell, a PV array, a PV panel, or a string of panels. For the sake of simplicity, PV power units 504 will hereafter be referred to as PV panels 504. In one embodiment, each of the n-1 DC-DC converting units 506 is coupled to one of n-1 PV panels 504, thereby leaving one of the n PV panels 504 uncoupled. As shown in FIG. 5, $PV_1$ is the uncoupled PV panel 504, whereas each of $PV_2$-$PV_n$ panels 504 is coupled to one of DC-$DC_1$, to DC-$DC_{n-1}$, converting units 506, respectively.

Figure 6:
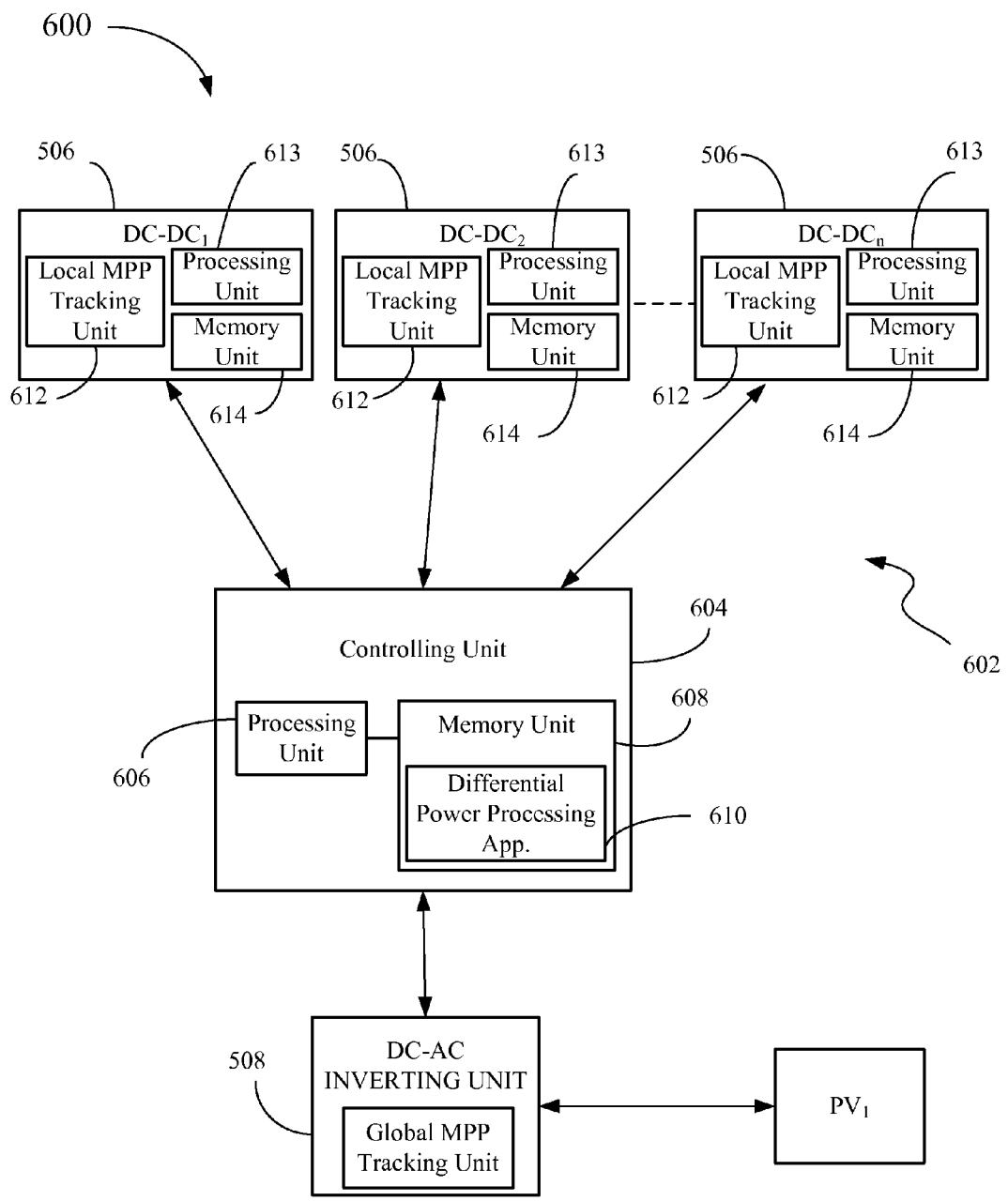
FIG. 6 is a schematic diagram illustrating an exemplary embodiment of a control system for controlling power generated by N series-connected PV panels.

Based on the configuration of FIG. 5, a controlling method or process, performed by a controlling unit 604, shown in FIG. 6, is configured to facilitate and control a series current $I_{pv}$ from PV panel string 503, so as to maximize the power output of the PV string 503 by operating each PV panel 504 at its MPP, and to minimize the total power flowing through the n-1 DC-DC converting units 506. As discussed above, each of the n-1 DC-DC converting units 506 is monitored and controlled by controlling unit 604 so that each of their respective n-1 PV panels 504 operates at or tracks a determined power output, such as a determined MPP value or target. In one embodiment, in order to achieve a global MPP tracking for PV panel string 503, DC-AC inverting unit 508 may be configured to monitor and control the uncoupled PV panel 504, e.g., $PV_1$ 504 of FIG. 5, to enable it to operate at or track its MPP value as determined by controlling unit 604. Alternatively, DC-AC inverting unit 508 is configured to maximize the overall power output of PV panel string 503 by also maximizing the power out of the uncoupled PV panel 504. As such, controlling unit 604 is configured to control n MPP values, i.e., n MPP variables, via n controlling actuators, i.e., n-1 DC-DC converting units 506 and one DC-AC inverting unit 508. This arrangement of controlling unit 604 enables power conversion system 502 to reach an operating level that substantially maximizes its total power output, which represents the total power generated by PV panels 504 less the power losses due to MPP tracking and power conversion.

During operation, while performing an MPP tracking locally, i.e., for each PV panel 504 or performing an MPP tracking globally, i.e., for the whole PV panel string 503, controlling unit 604 monitors and compares the n currents generated by the n PV panels 504, and based on the current comparison determines the series current $I_{pv}$. Moreover, controlling unit 604 controls n-1 PV panels 504, via their respective n-1 DC-DC converting units 506 and AC-DC inverting unit 508, respectively, so that each of the generated photovoltaic currents is substantially equal to the determined $I_{pv}$ series current. As such, controller unit 604, via a differential power processing application 610, is configured to ensure each of the generated photovoltaic currents is substantially equal to the determined $I_{pv}$ series current, so that the bulk of the generated photovoltaic power flows through the series-connected PV panels 504, and only a small fraction or percentage of this photovoltaic generated power is processed by n-1 DC-DC converting units 506, as needed to monitor and control power production of each of the n-1 coupled PV panels 504 at or near their respective determined MPPs. Thus, during operation, each of n-1 DC-DC converting units 506 may only need to process a small amount or percentage of the power generated by the corresponding PV panel 504, since only a small adjustment to its generated PV panel current may be required to make it substantially equal to $I_{pv}$ series current or be within a predetermined threshold range of $I_{pv}$ series current while the corresponding PV panel 504 is operated at or near its target MPP value. As stated above, for similarly manufactured and sized PV panels 504 exposed to substantially identical sunlight conditions, their individual MPPs may be substantially similar, which may lead to a substantially small MPP variance throughout PV panel string 503.

Based on the PV string configuration of FIG. 5, during operation, if one of the n-1 coupled PV panels 504, say for example $PV_2$ 504, is determined to be producing a low current, i.e., $I_{pv2}$, compared to the $I_{pv}$ series current, because of shading conditions for example, controlling unit 604 determines whether a difference between the $I_{pv}$ series current and the low current $I_{pv2}$ is greater than a predetermined current difference threshold. In case, the determined difference is greater than the predetermined current difference threshold, then controlling unit 604 is configured to trigger the corresponding converting unit DC-$DC_1$ 506 to shunt PV panel $PV_2$ 504 and perform as a bypass unit to the $I_{pv3}$ current, which is output by PV panel $PV_3$ 504, and provide it as an input current to PV panel $PV_1$ 504, thereby delivering the $I_{pv3}$ current around shunted low-performing PV panel $PV_2$ 504. In one embodiment, the predetermined current difference threshold may be about 10% of the $I_{pv}$ series current. Alternatively, any other value for the predetermined current difference threshold may be chosen. During this bypass activity, controlling unit 604 may also be configured to trigger converting unit DC-$DC_1$ 506 to direct the low current $I_{pv2}$ to electrical node 512 where it may be added to the $I_{pv}$ series current.

Alternatively, in lieu of using controlling unit 606, the bypass activity (PV panel shunting) may be triggered by a DC-DC converting unit 506 when it determines that the correspondingly coupled PV panel 504 generates a current that is less than a predetermined current difference threshold of currents generated by adjacent PV panels 504.

As it would be obvious to one of ordinary skill in the art, the configuration of FIG. 5 may be extended to an individual PV cell level, in which case each PV cell may be coupled to a differential power processing system or circuitry, and no reverse diodes, as taught in the prior art, may be required. That is, the MPP Tracking process algorithm may be implemented locally at the level of a PV element, which may be a PV cell, a string of PV cells, a PV panel, or a string of PV panels.

Based on the above discussion about DC-DC converting units 506, the differential power processing provides at least the following features:

Since DC-DC converting units 506 process only a small fraction of the total power generated by PV string 503, power losses are substantially low in comparison to DC-DC converting units that are required to convert all of the power generated by their respective PV panels 504.

Sizes of DC-DC converting units 506 can be relatively small given the units limited power ratings requirements.

Costs of these DC-DC converting units 506 can be substantially low given their smaller sizes and limited power ratings.

Dynamic requirements and protection needs can be substantially low since each DC-DC converting unit 506 is configured to manage only small current differences.

Now referring to FIG. 6, an exemplary embodiment 600 of a computing system 602 for controlling and optimizing power generated by n series-connected PV panels 504 is shown. As above, computing system 602 includes controlling unit 604 coupled to n-1 DC-DC converting units 506 and to an AC-DC inverting unit 508. Each of n-1 DC-DC converting units 506 is configured to make each respective PV panel 504 operate at its MPP, which corresponds to the operating condition that facilitates capture of the most energy, and thereby generation of the most power. This is accomplished via MPP tracker units 612, each of which may be an integral element of one of n-1 DC-DC converting units 506. Alternately, MPP tracker units 612 may be stand-alone units coupled to one or more of the n-1 DC-DC converting units 506. As shown, each DC-DC converting unit 506 may include a processing unit 613 and a memory unit 614, both in communication with corresponding MPP tracker unit 612.

Controller unit 604 includes a processing unit 606 and a memory unit 608, which in turn includes a differential power program or application 610. Processor unit 606 is configured to execute instructions and to carry out operations associated with computing system 602. For example, using instructions retrieved from memory unit 608, processor unit 606 may control the reception and manipulation of input and output data between components of computing system 602. Various architectures can be used for processor unit 606, including dedicated or embedded processor or microprocessor (µP), single purpose processor, controller or a microcontroller (µC), application-specific integrated circuit (ASIC), any combination thereof, and so forth. In most cases, processor unit 606 together with an operating system operates to execute computer code and produce and use data.

Memory unit 608 generally provides a place to store computer code and data that are used by computing system 602. Memory unit 608 may include but not limited to non-volatile memory, such as read-only memory (ROM, flash memory, etc.), volatile memory, such as random-access memory (RAM), a hard disk drive and/or the like. As stated above, memory unit 608 includes differential power program or application 610, which is configured to monitor currents generated by the n PV panels 504, to determine the $I_{pv}$ series current, and to trigger the n-1 DC-DC converting units 506 to operate their respective n-1 PV panels 504 at their MPP values to achieve global MPP tracking. Alternatively, analog MPP trackers and analog DC-DC converting units, as well as analog DC-AC inverting units may be implemented for the process of maximizing power conversion, via either local MPP tracking or a global MPP tracking.

Figure 7:
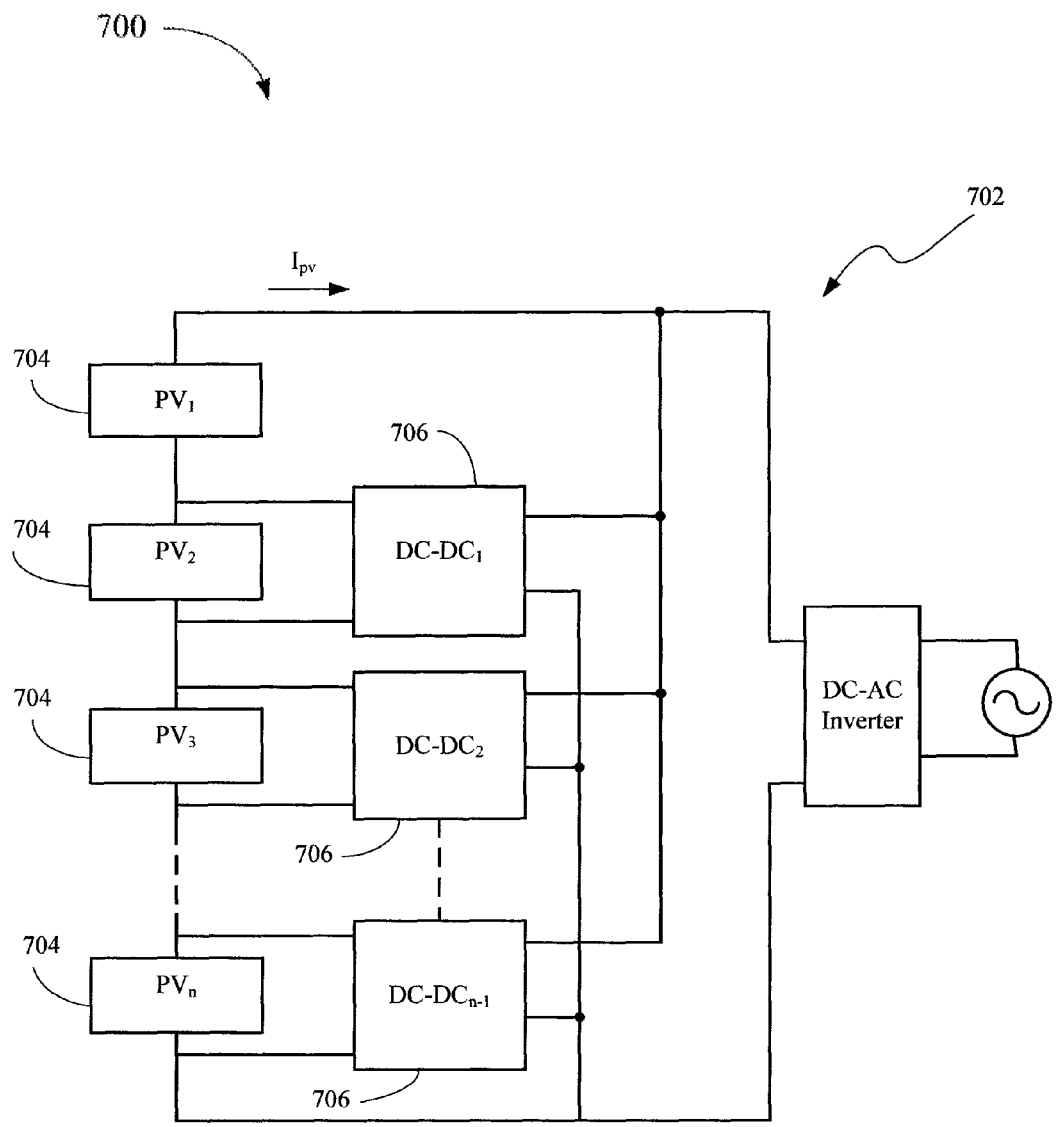
FIG. 7 is a schematic diagram of an exemplary embodiment of a power conversion system including n PV panels connected in series and n-1 DC-DC converting units connected in parallel.

Now referring to FIG. 7, an exemplary embodiment 700 of a power conversion system 702, including n PV panels 704 connected in series and n-1 DC-DC converting units 706 connected in parallel, is shown. Similarly to the system configuration of FIG. 5, during operation as the bulk of the power, generated by series-connected PV panels 704, flows directly through PV panels 704, only small power differences are made to flow through DC-DC converting units 706 via controlling unit 704, in order to mitigate current mismatches between the generated PV panel currents, thereby substantially matching each of the generated PV panel currents with the determined $I_{pv}$ series current. Further, upon determination by controlling unit 604 that a current difference between a low current generated by one of n-1 PV panels 704, coupled to one of n-1 DC-DC converting units 706, and the $I_{pv}$ series current is greater than the predetermined current difference threshold, then the corresponding DC-DC converting unit 706 is configured to perform as a bypass unit to the $I_{pv}$ series current output by the preceding PV panel 704 and provide it as an input current to the subsequent PV panel 704, thereby delivering the $I_{pv}$ series current around the low-performing PV panel 704. During this bypass activity, controlling unit 604 may also be configured to trigger the corresponding DC-DC converting unit 706 to direct the low generated current to an electrical node where it may be added to the $I_{pv}$ series current.

Figure 8A:
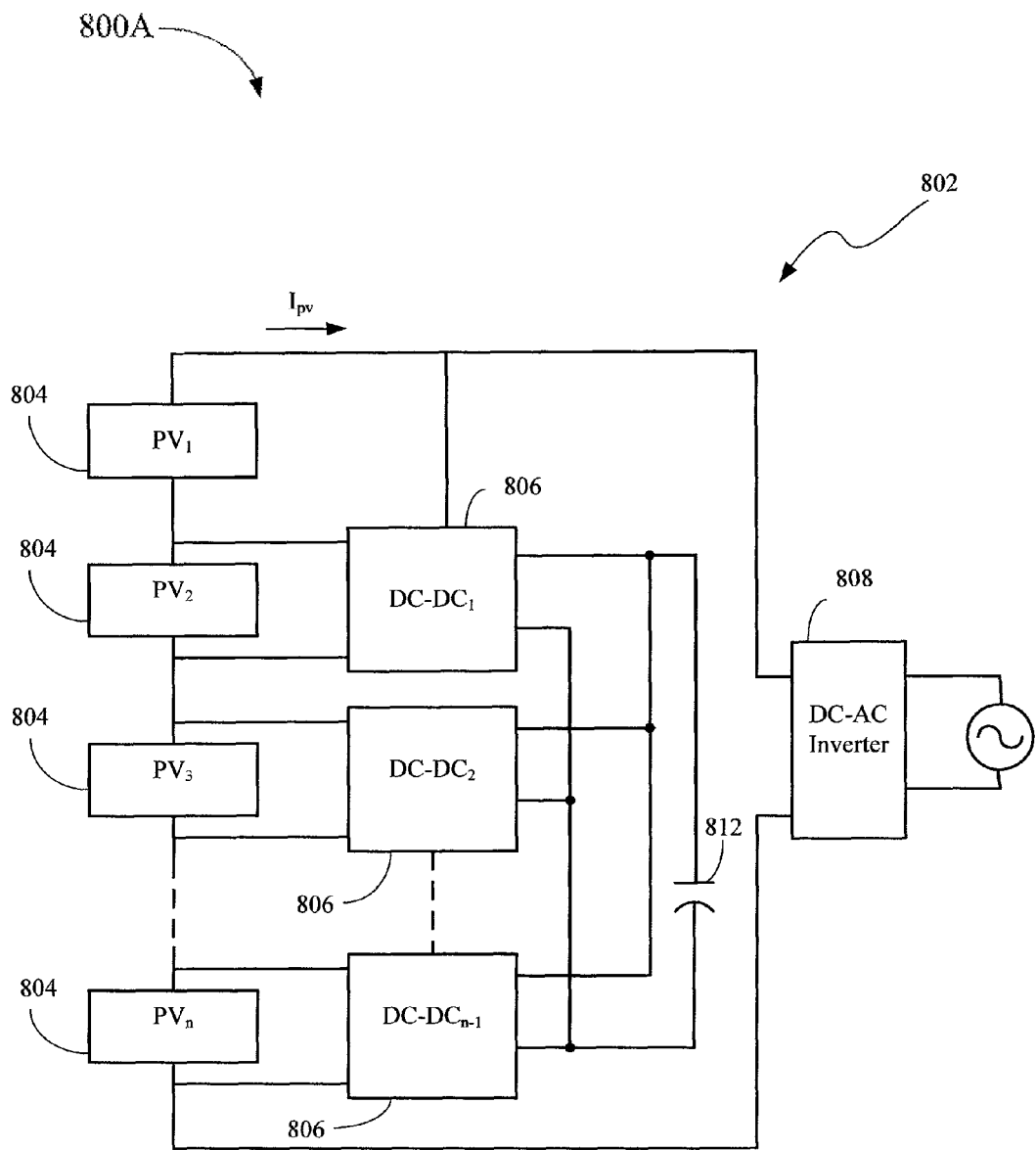
FIG. 8A is a schematic diagram of an exemplary embodiment of a power conversion system including n PV panels connected in series and n-1 DC-DC converting units connected in parallel to an independent DC bus.

Now referring to FIG. 8A, an exemplary embodiment 800A of a power conversion system 802, including n PV panels 804 connected in series and n-1 DC-DC converting units 806 connected in parallel, is shown. In this arrangement of FIG. 8A, power conversion system 802 includes a DC power or virtual bus 812. In this embodiment, each of n-1 DC-DC converting units 806 may send a portion of their respective power, diverted from their corresponding PV panels 804, to an energy storage unit 812, hereafter referred to as virtual bus 812, rather than to a main DC bus (not shown) that may provide input to DC-AC inverting unit 808. Virtual bus 812 may be used to support control, communication, and other functions, associated with power conversion system 802, that may need a low-voltage or separate DC power supply.

Figure 8B:
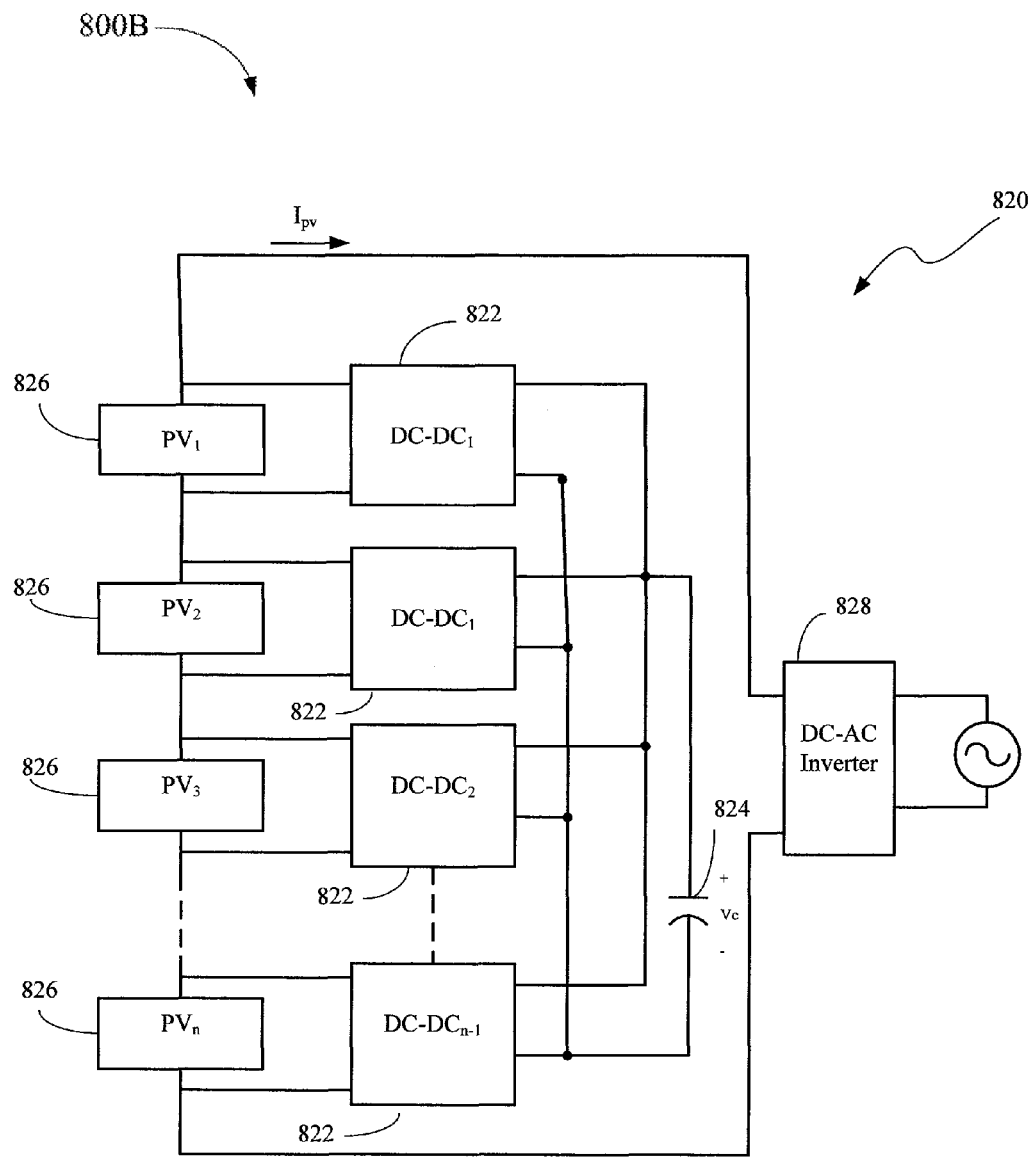
FIG. 8B is a schematic diagram of an exemplary embodiment of a power conversion system including n PV panels connected in series and n DC-DC converting units connected in parallel to an independent DC bus.

Now referring to FIG. 8B, another exemplary embodiment 800B of power conversion system 820 includes n DC-DC converting units 822 connected in parallel, instead of only n-1 DC-DC converting units 806 as in power conversion system 802. Similarly to the configuration of FIG. 8A, n DC-DC converting units 822 may send a portion of their respective powers to a virtual bus 824 rather than to the main DC bus (not shown) associated with AC-DC inverting unit 828. As stated above in relation to virtual bus 812, virtual bus 824 may be configured to support control, communication, and other functions, associated with power conversion system 820, that may need low-voltage or separate DC power supply. For example, in case virtual bus 824 is a capacitive element, if during operation its voltage $V_c$ is decreasing then it may be an indication that at least one of DC-DC converting units 822 may be drawing power from virtual bus 824 in order to be able to maintain a tracking of the predetermined MPP of the corresponding PV panel 826. Alternately, if the voltage $V_c$ of virtual bus 824 is increasing, then it may be an indication that one or more of DC-DC converting units 822 is providing power to virtual bus 824 while maintaining an on-going tracking of the predetermined MPP of the corresponding PV panel 826. Moreover, in this arrangement of FIG. 8B, the monitoring and controlling of current and power generated by individual PV panels 826 may be performed by corresponding DC-DC converting units 822, rather than centrally by a central control unit, such as control unit 604 of FIG. 6. That is, each of DC-DC converting units 822 may be performing local MPP tracking independently of a central control unit.

Figure 9:
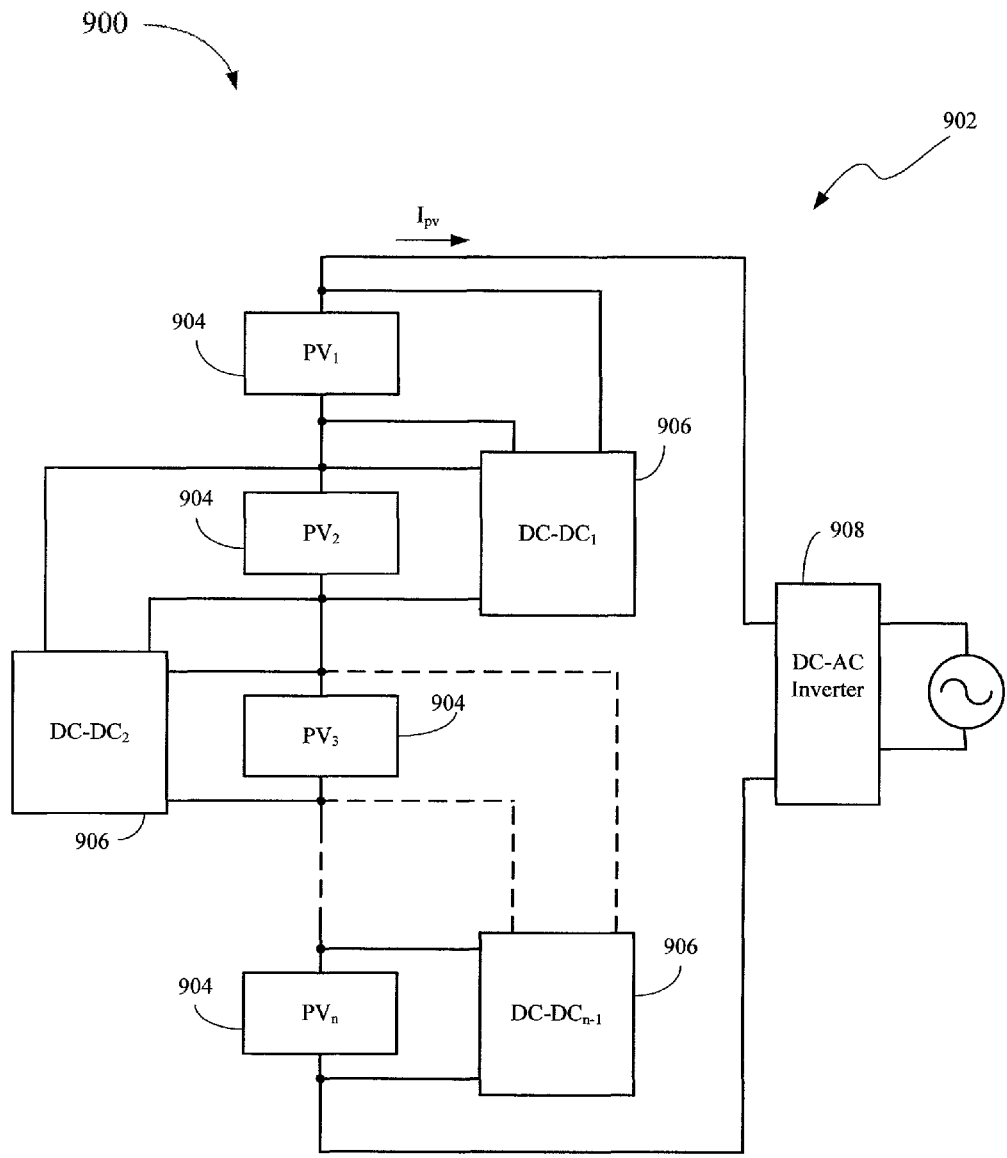
FIG. 9 is a schematic diagram of an exemplary embodiment of a power conversion system including n PV panels connected in series and n-1 DC-DC converting units, with each DC-DC converting units connected to a couple of PV panels.

Now referring to FIG. 9, an exemplary embodiment 900 of a power conversion system 902 including n PV panels 904, connected in series, and n-1 DC-DC converting units 906, with each of the DC-DC converting units 906 being connected to a couple of PV panels 904. In this embodiment, each of n-1 DC-DC converting units 906 is also configured to perform as a power exchange unit between the correspondingly connected couple of PV panels 904. As such, in this FIG. 9 system configuration, any PV panel differential power can be exchanged entirely among PV panels 904 as there is no second power flow circuitry, i.e., no secondary power path, connecting n-1 DC-DC converting units 906 to AC-DC inverting unit 908. This differential power exchange enables PV panels 904 to be adjusted, physically with respect to incident light, in real time in order to adjust and substantially match their respective MPP requirements. Moreover, because there is no second power flow circuitry, the value of the $I_{pv}$ series current is determined so as to make a net secondary power equal to zero, thereby automatically making the power flowing through n-1 DC-DC converting units 906 as low as possible, thereby maximizing power conversion efficiency. Due to the zero value of the secondary current, power conversion system 902 is thus a self-contained power conversion system. In this embodiment, each of the DC-DC converting units 906 is either coupled to a pair of adjacent PV panels 904 or to a pair of non-adjacent PV panels 904. As such, the couple of PV panels 904 connected to an individual DC-DC converting unit 906 need not be adjacent to one another. Moreover, in this arrangement of FIG. 9, the monitoring and controlling of current and power generated by individual PV panels 904 may be performed by corresponding DC-DC converting units 906, rather than centrally by a central control unit, such as control unit 604 of FIG. 6. That is, each of DC-DC converting units 906 may be performing local MPP tracking independently of a central control unit.

Figure 10:
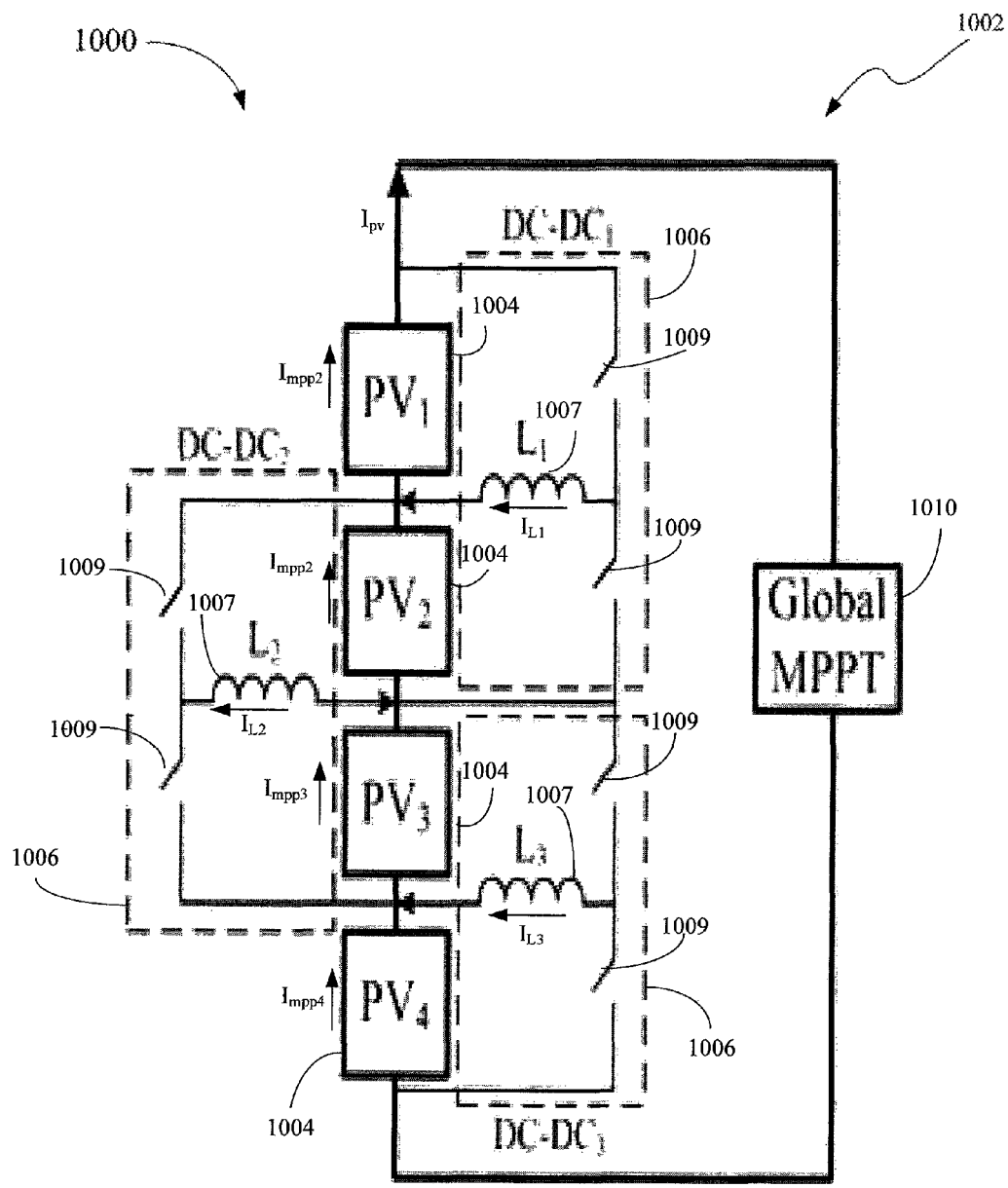
FIG. 10 is a schematic diagram of an exemplary embodiment of a power conversion system, similar to that of FIG. 9, including a plurality of PV panels connected in series and configured to enable differential energy transfer between PV panels.

FIG. 10 illustrates an exemplary embodiment 1000 of power conversion system 1002, which is configured, to provide differential power transfers between neighboring PV panels 1004. To highlight aspects of the herein-introduced differential power processing, an exemplary operation of power conversion system 1002 is examined using a buck-boost topology for the DC-DC converting units 1006. As shown, power conversion system 1002 includes four PV panels $PV_1$-$PV_4$ 1004 and three differential DC-DC converting units $DC-DC_2$ to $DC-DC_4$ 1006. Moreover, any two adjacent DC-DC converting units 1006 are coupled to a common PV panel 1004. For example, converting units $DC-DC_1$ and $DC-DC_2$ are both coupled to PV panel $PV_2$ 1004, while converting units $DC-DC_2$ and $DC-DC_3$ are both coupled to PV panel $PV_3$ 1004. As illustrated, each differential DC-DC converting unit 1006 includes an inductive storage element L 1007, and a couple of switching elements 1009. Global MPPT 1010 is also shown.

In power conversion system 1002, panel $PV_3$ 1004 may be subject to a shading condition while PV panels $PV_1$, $PV_2$ and $PV_4$ 1004 may not be subject to a similar shading condition. Assuming all other physical and electrical aspects of each of PV panels $PV_1$-$PV_4$ 1004 are substantially similar, based on operation data received or collected from PV panels $PV_1$-$PV_4$ 1004, assume their corresponding voltages, attained while operating at their respective MPPs, are $V_{mpp1}$=$V_{mpp2}$=$V_{mpp4}$=37.09 volts (V) and $V_{mpp3}$=36.80 V. The duty ratios of DC-DC converting units 906 are controlled, via controlling unit 604, to regulate PV panel voltages of $PV_2$, $PV_3$, and $PV_4$ 10004 at the respective local MPPs. For the sake of simplicity, the MPP for $PV_1$ can be represented as being accomplished through a variable resistor (not shown) whose value is selected to maximize a global power output (in this case, R=29.8 Ohms) and, in effect, meet the local MPP of PV panel $PV_1$ 1004. The currents flowing in power conversion system 1002 flow in such a way that each of PV panels $PV_1$-$PV_4$ 1004 provides its MPP current, as follows: $I_{mpp1}$=$I_{mpp2}$=$I_{mpp4}$=5.09 amperes (A) and $I_{mpp3}$=4.58 A. After some analysis, it can be shown that the currents in the differential DC-DC converting units 1006 are $I_{L1}$=0.2535 A, $I_{L2}$=0.509 A, and $I_{L3}$=−0.2545 A. These three current values enable each of PV panel $PV_1$-$PV_4$ 1004 to operate at their respective MPPs.

Additionally, the here-in introduced differential power processing can lead a substantial simplification of the global MPP tracking since local PV panel minima are eliminated, providing each DC-DC converting unit 1006 is able to meet the local MPP condition and that there are no local minima for the respective PV panels 1004.

Figure 11:
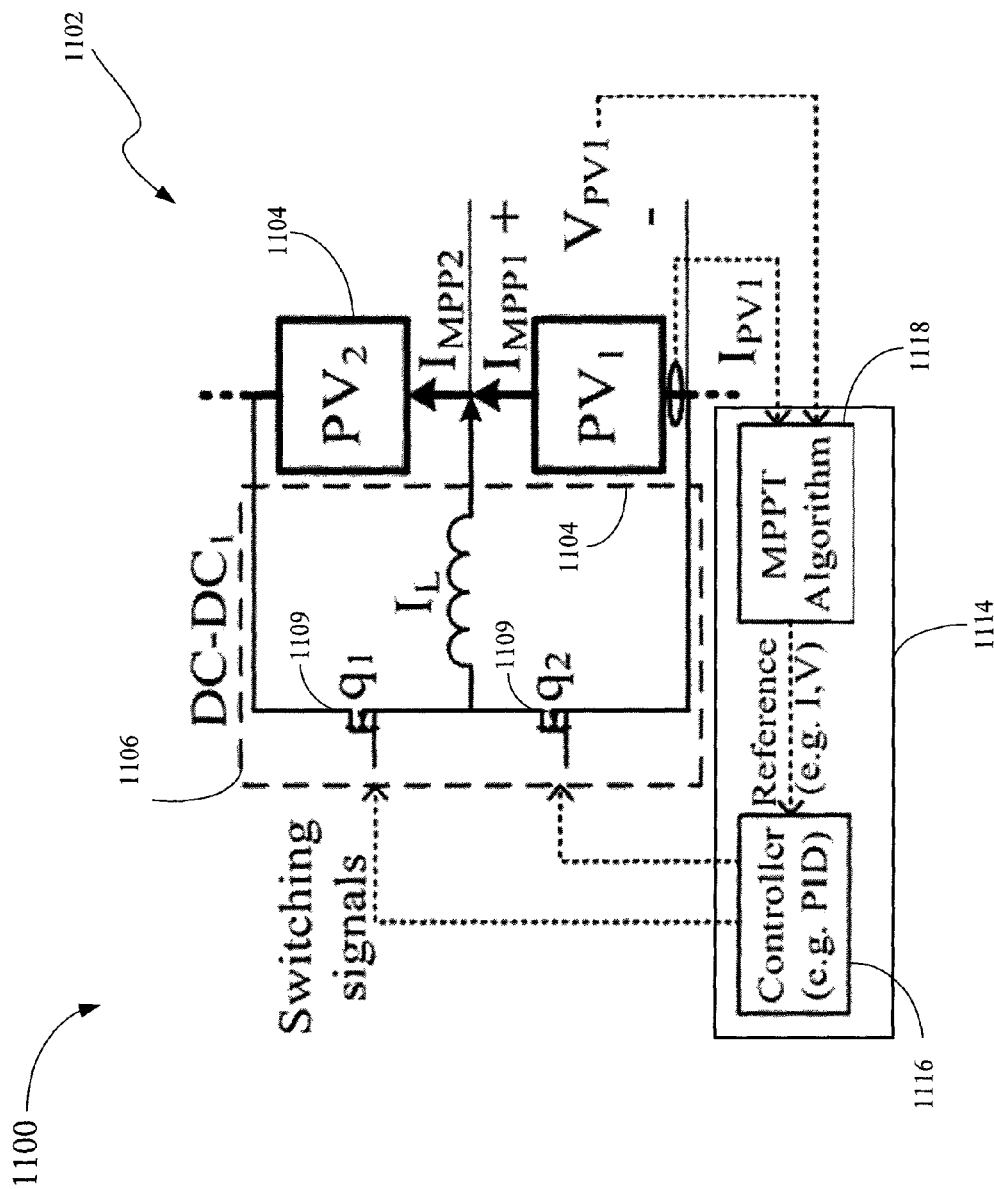
FIG. 11 is a schematic diagram illustrating an exemplary embodiment of a local controller unit for providing MPP tracking in a differential power conversion system.

Now referring to FIG. 11, a schematic diagram illustrates an exemplary embodiment 1100 of a local controller system 1114, associated with or embodied in a differential DC-DC converting unit 1106 for providing power conversion monitoring and control in differential power conversion system 1102. As shown, local controller system 1114 includes a controller or controlling unit 1116 and an MPPT application or algorithm 1118. A selection of MPP tracking algorithms 1118 is not constrained by this differential power approach, i.e., any MPPT algorithm may be feasible, although some may be more effective. For example, if $DC-DC_1$ differential converting unit 1106 is implemented on a sub-module basis where a control overhead (energy that controller system 1114 consumes) may need to be small, substantially simple MPPT algorithms may be used. During operation, once voltage $V_{PV1}$ and current $I_{PV1}$ of panel $PV_1$ are measured, MPPT algorithm 1118 may use this measurement information to generate an operating reference for controlling unit 1116. This generated operating reference may be a current reference, a voltage reference, a duty ratio, etc. . . . , depending on the controller type. Controlling unit 1116 is configured to generate switching signals for switching elements $q_1$ and $q_2$ 1109, such as through a pulse width modulation technique, although pulse frequency modulation technique and other suitable techniques may also be feasible. The switching signals control the turn-on/turn-off action of the switches $q_1$ and $q_2$ 1109 in differential DC-DC converting unit 1106.

Moreover, in the above-discussed embodiments, the local control of PV panels, via their respective DC-DC converting units, enables distributed diagnostics and monitoring of these PV panels. This local control arrangement can help detect defective PV panels, which may lead to reducing time to repair, and improve understanding of the operation conditions of the power conversion system. The differential power converting units may also shunt (directly bypass by a switching element) a failed or defective PV panel, or a PV panel whose MPP current is determined to be too low with respect to the determined $I_{pv}$ series current. Furthermore, as discussed above, each of differential power converting units may also be configured to open the PV panel string and stop the flow of current and power for safety reasons or trigger a shunt-based string-level protection. Thus, in the above-discussed embodiments, an overall reliability of the power conversion system is improved since a failure in a PV panel or in a differential power converting unit need not cause more extensive system failure or general system failure.

Figure 12:
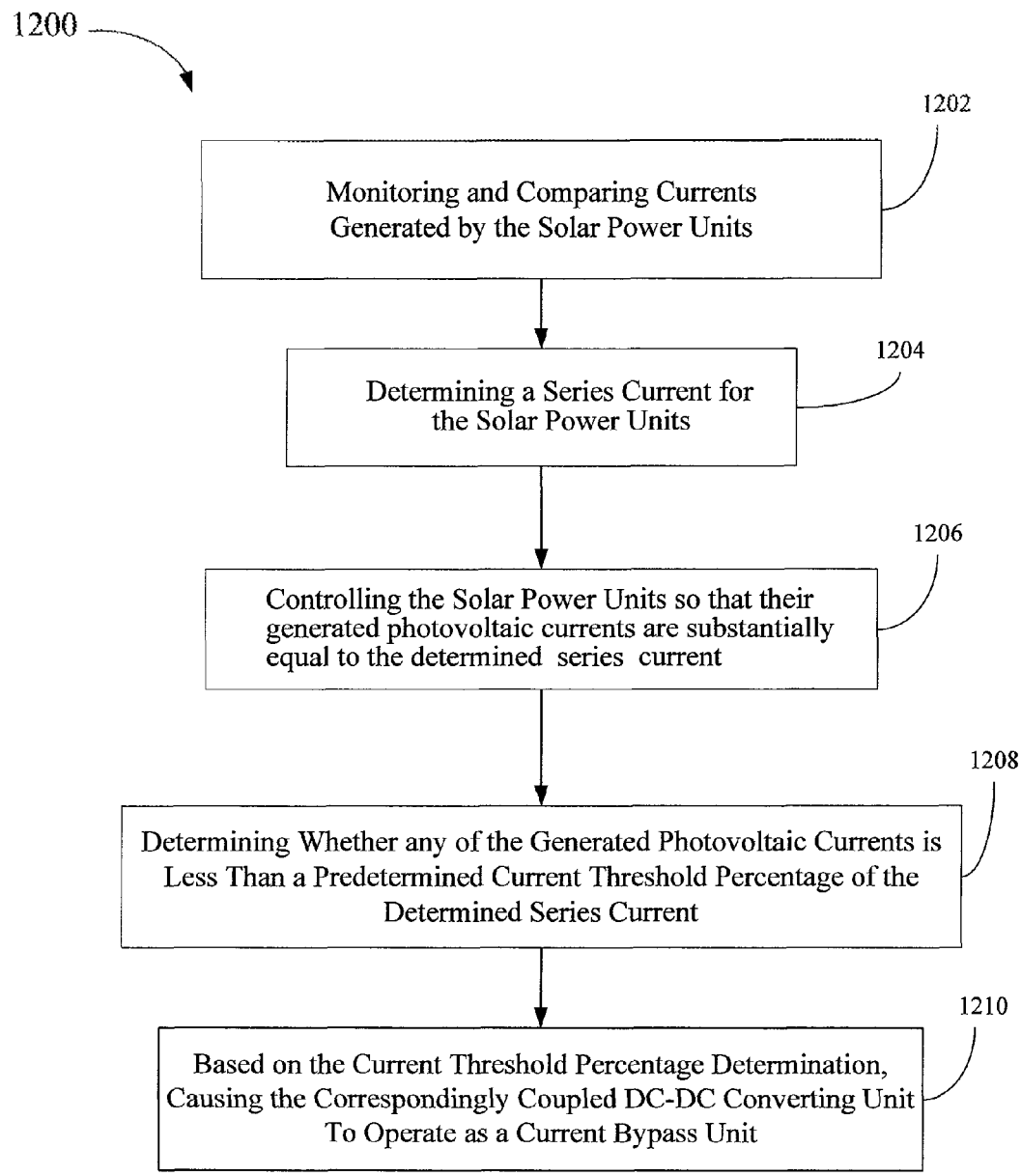
FIG. 12 is a flow chart illustrating an embodiment of a method for controlling and optimizing power generated by n series-connected PV panels.

Now referring to FIG. 12, a flow chart 1200 illustrating an embodiment of a method for controlling power generated by n series-connected PV panels associated with any of the above-discussed converting unit arrangements. At step 1202, controller unit 604 is configured to monitor and compare a plurality of currents generated the n series-connected solar power units. Based on the comparison, controller unit 604 is configured to determine a series current for the n series-connected solar power units, at step 1204. Upon determination of the series current, the n series-connected PV panels are controlled via the n-1 power converting units and the power inverting unit, so that each of the generated photovoltaic currents is substantially equal to the determined series current, at step 1206. Controller unit 604 is further configured to determine whether any of the generated photovoltaic currents is less than a predetermined current threshold percentage of the determined series current, at step 1208. If it is determined that one or more of the generated photovoltaic currents is less than a predetermined current threshold percentage, then controller unit 604 is further configured to cause the corresponding DC-DC converting units to operate as current bypass units, at step 1210.

The above discussed embodiments of power conversion systems enable the following:

A power production from individual PV panels is substantially maximized under realistic environmental conditions.

An actual energy production is improved because of local and global MPP operations.

An incremental cost for any of the above discussed embodiments is substantially less than that of prior-art panel-based converting units.

DC-DC converting units needed to implement the above-discussed method may not need to have high performance characteristics to produce system benefits.

Since only fractional power is processed by the DC-DC converting units, an implementation of the above-discussed power conversion systems lends itself to subpanel and even cell-level power processing.

While a power managed by differential converting units may increase as environmental conditions vary more widely, as with shading, benefits are still possible even with limited action. For example, under partial shading, any differential power management improves production. In addition, differential conditions affecting PV panels may be typically temporary, so the converting units involved may not need to process substantial power levels for more than a few minutes—unless a cell is damaged or soiled. In the case of severe soiling that may compromise performance of a PV panel or PV cell for a long time, the associated exchange converting unit may simply bypass the PV panel or PV cell entirely, thus avoiding the need to actually process any associated power. These above-discussed power conversion systems can be applied to large PV systems with many series-connected PV panels, or as a basis for a new class of cell-by-cell PV power processing.

Figure 13:
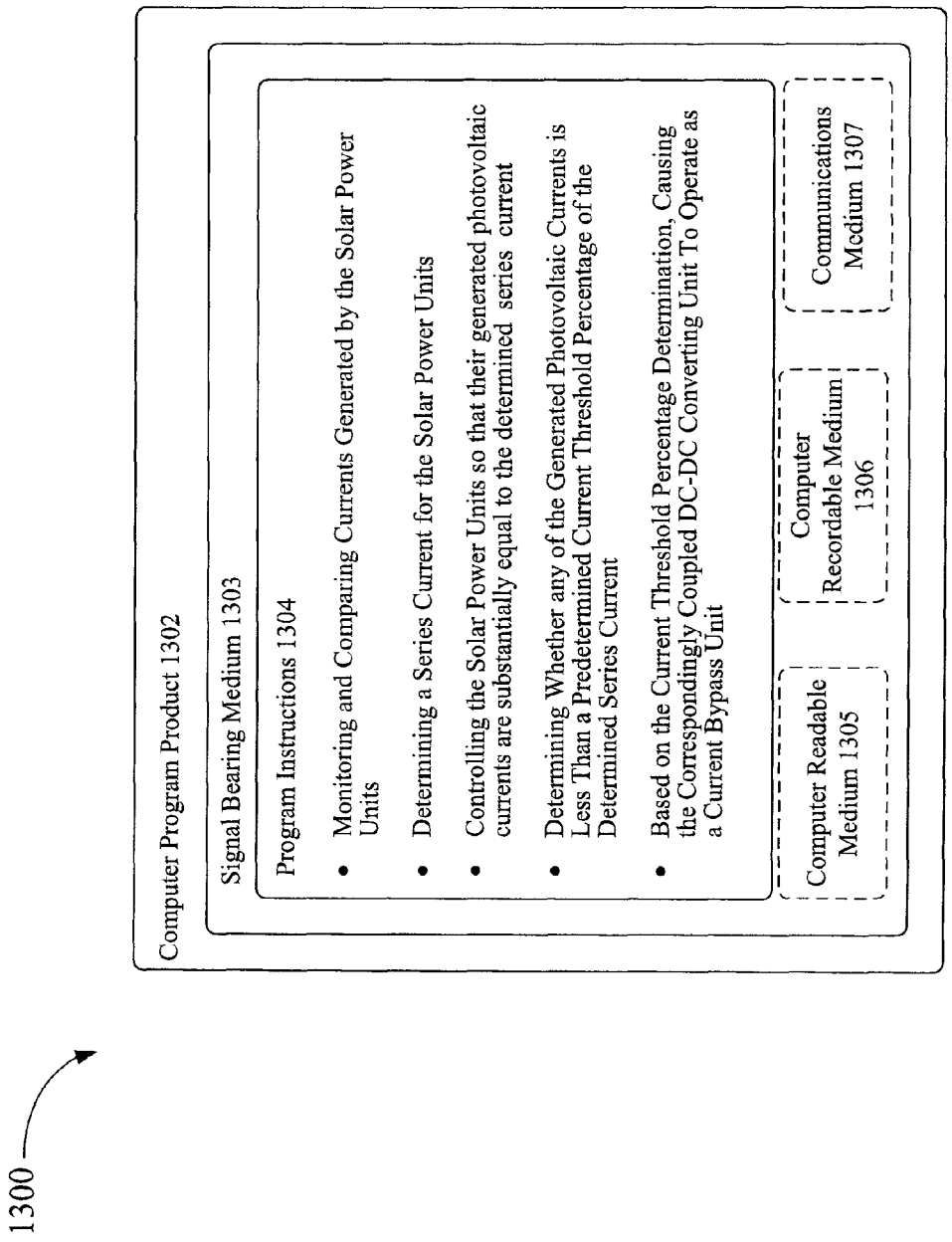
FIG. 13 is a schematic diagram illustrating a conceptual partial view of an example computer program associated with the method of FIG. 12.

In some embodiments, the disclosed methods may be implemented as computer program instructions encoded on a non-transitory computer-readable storage media in a machine-readable format. FIG. 13 is a schematic 1300 illustrating a conceptual partial view of an example computer program product 1302 that includes a computer program for executing a computer process on a computing device, arranged according to at least some embodiments presented herein. In one embodiment, the example computer program product 1302 is provided using a signal bearing medium 1303. The signal bearing medium 1303 may include one or more programming instructions 1304 that, when executed by one or more processors may provide functionality or portions of the functionality described above with respect to FIG. 12. Thus, for example, referring the embodiment shown in FIG. 12, one or more features of blocks 1202, 1204, 1206, 1208, and/or 1210 may be undertaken by one or more instructions associated with the signal bearing medium 1303.

In some examples, the signal bearing medium 1303 may encompass a non-transitory computer-readable medium 1305, such as, but not limited to, a hard disk drive, a Compact Disc (CD), a Digital Video Disk (DVD), a digital tape, memory, etc. In some implementations, the signal bearing medium 1303 may encompass a computer recordable medium 1306, such as, but not limited to, memory, read/write (R/W) CDs, RJWDVDs, etc. In some implementations, the signal bearing medium 1303 may encompass a communications medium 1307, such as, but not limited to, a digital and/or an analog communication medium (e.g., a fiber optic cable, a waveguide, a wired communications link, a wireless communication link, etc.). Thus, for example, the signal bearing medium 1303 may be conveyed by a wireless form of the communications medium 1007 (e.g., a wireless communications medium conforming with the IEEE 802 standards or other transmission protocols).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims, along with the full scope of equivalents to which such claims are entitled. It is also to be understood that the terminology used herein is for the purpose of describing particular embodiments only, and is not intended to be limiting.

What is claimed is:

1. A solar power system for optimizing solar power conversion, comprising:
a set of n solar power units connected in series, wherein each of the n solar power units generates a DC photovoltaic current and produces a DC photovoltaic voltage;
a set of n-1 DC-DC converting units, each of the n-1 DC-DC converting units is coupled to at least one of the n solar power units, and wherein each of the n-1 DC-DC converting units is configured to control the correspondingly connected solar power units to operate at a target current generation;
a DC-AC inverting unit for inverting a cumulative DC photovoltaic voltage of the n produced photovoltaic voltages to an AC power signal for distribution to one or more AC loads, wherein the DC-AC inverting unit is configured to control operation of any one of the n solar power units, which is not coupled to one of the n-1 DC-DC converting units; and
a controlling unit coupled to the n-1 DC-DC converting units and to the DC-AC inverting unit, wherein the controlling unit monitors and compares the n currents generated by the n solar power units, wherein based on the current comparison the controlling unit determines a series current and controls the n solar power units, via the n-1 DC-DC converting units and the DC-AC inverting unit, so that each of the generated photovoltaic currents is substantially equal to the determined series current, and wherein when the controlling unit determines that one of the n-1 solar power units, coupled to one of the n-1 DC-DC converting units, generates a photovoltaic current that is less than a predetermined current threshold percentage of the determined series current, the controlling unit causes the correspondingly coupled DC-DC converting unit to operate as a current bypass unit.

2. The solar power system of claim 1, wherein each of the n currents is generated based on a corresponding MPP tracking determined by the correspondingly coupled DC-DC converting unit.

3. The solar power system of claim 1, wherein each of the n currents is generated based on a global MPP tracking determined by the DC-AC inverting unit.

4. The solar power system of claim 1, wherein the n-1 DC-DC converting units are connected in series or in parallel.

5. The solar power system of claim 1, wherein each of the n-1 DC-DC converting units is connected to two solar power units.

6. The solar power system of claim 1, wherein the predetermined current threshold percentage of the determined series current is about ninety percent.

7. The solar power system of claim 1, further comprising a first DC bus connected to the DC-AC inverting unit, and a second DC bus connected to each of the n-1 parallel connected DC-DC converting units.

8. A solar power system for optimizing solar power conversion, comprising:
   a plurality of solar power units connected in series, wherein each of the plurality solar power units generates a DC photovoltaic current and produces a DC photovoltaic voltage; and
   a plurality of DC-DC converting units, each of the plurality DC-DC converting units is coupled to at least one of the plurality of solar power units, wherein each of the plurality of DC-DC converting units is configured to control operation of the correspondingly connected solar power units, wherein an individual DC-DC converting unit is configured to determine whether a correspondingly connected solar power unit generates a corresponding DC photovoltaic current that is less than a predetermined threshold percentage of a target series current, and based on the determination that the corresponding DC photovoltaic current is less than the predetermined threshold percentage of the target series current, the individual DC-DC converting unit is configured to shunt the correspondingly connected solar power unit while the other solar power units remain connected in series.

9. The solar power system of claim 8, wherein the generated corresponding DC photovoltaic current is less than a predetermined threshold percentage of the target series current because of a defective operating state of the correspondingly connected power unit.

10. The solar power system of claim 8, wherein the generated corresponding DC photovoltaic current is less than a predetermined threshold percentage of the target series current because of a shading of the correspondingly connected power unit.

11. The solar power system of claim 8, wherein the plurality of DC-DC converting units are connected in series or in parallel.

12. The solar power system of claim 8, wherein each of the plurality of DC-DC converting units is connected to two solar power units.

13. The solar power system of claim 8, further comprising a first DC bus connected to the DC-AC inverting unit, and a second DC bus connected to each of the plurality of DC-DC converting units.

14. The solar power system of claim 8, wherein the predetermined current threshold percentage of the determined series current is about ninety percent.

15. A solar power system for optimizing solar power conversion, comprising:
   a plurality of solar power units connected in series, wherein each of the plurality of solar power units generates a DC photovoltaic current and produces a DC photovoltaic voltage;
   a plurality of DC-DC converting units, each of the plurality of DC-DC converting units is coupled to at least one of the plurality of solar power units, wherein each of the plurality of DC-DC converting units is configured to control the correspondingly connected solar power units so that they each generate at a corresponding target current; and
   a controlling unit coupled to the plurality of DC-DC converting units, wherein the controlling unit monitors and compares the plurality of currents generated by the plurality of solar power units, wherein based on the current comparison the controlling unit determines a series current and controls the plurality of solar power units, via the plurality of DC-DC converting units, so that each of the generated photovoltaic currents is substantially equal to the determined series current,
   wherein,
   each of the plurality of DC-DC converting units is configured to determine an operating status of each of the correspondingly connected solar power units, and to report the operating status to the controlling unit.

16. The solar power system of claim 15, wherein reporting the operating status of an individual correspondingly connected solar power unit comprises reporting whether the individual correspondingly connected solar power unit is in a defective state.

17. The solar power system of claim 15, wherein the plurality of DC-DC converting units are connected in series or in parallel.

18. The solar power system of claim 15, wherein each of the plurality of DC-DC converting units is connected to two solar power units.

19. The solar power system of claim 15, further comprising a first DC bus connected to the DC-AC inverting unit, and a second DC bus connected to each of the parallel connected DC-DC converting units.

20. A solar power system for optimizing solar power conversion, comprising:
   a plurality of solar power units connected in series, wherein each of the plurality of solar power units generates a DC photovoltaic current and produces a DC photovoltaic voltage;
   a plurality of DC-DC converting units, each of the plurality of DC-DC converting units is coupled to at least one of the plurality of solar power units, wherein each of the plurality of solar power units is coupled to two of the plurality of DC-DC converting units; and
   a controlling unit coupled to the plurality of DC-DC converting units, wherein the controlling unit monitors and compares the plurality of currents generated by the plurality of solar power units, wherein based on the current comparison the controlling unit determines a series current and controls the plurality of solar power units, via the plurality of DC-DC converting units, so that each of the generated photovoltaic currents is substantially equal to the determined series current.

* * * * *